United States Patent
Easter et al.

(10) Patent No.: US 9,503,017 B1
(45) Date of Patent: Nov. 22, 2016

(54) INFRASTRUCTURE-GRADE INTEGRATED VOLTAGE CONTROLLED OSCILLATOR (VCO) WITH LINEAR TUNING CHARACTERISTICS AND LOW PHASE NOISE

(75) Inventors: Jacob K. Easter, Thornton, CO (US); William Thales Roberts, Highland, UT (US); Shayan Farahvash, Cupertino, CA (US); David Conrad Stegmeir, San Jose, CA (US); Li Jin, Sunnyvale, CA (US)

(73) Assignee: Qorvo US, Inc., Greensboro, NC (US)

( * ) Notice: Subject to any disclaimer, the term of this patent is extended or adjusted under 35 U.S.C. 154(b) by 37 days.

(21) Appl. No.: 12/892,049

(22) Filed: Sep. 28, 2010

Related U.S. Application Data (60) Provisional application No. 61/246,869, filed on Sep. 29, 2009.

(51) Int. Cl.
  *H03B 5/12* (2006.01)

(52) U.S. Cl.
  CPC ....... *H03B 5/1265* (2013.01); *H03B 2200/005* (2013.01); *H03B 2201/011* (2013.01)

(58) Field of Classification Search
  CPC .................. H03B 5/124; H03B 5/1243; H03B 5/1246; H03B 5/125; H03B 5/1253; H03B 5/1262; H03B 5/1265; H03B 2200/004; H03B 2200/005; H03B 2201/011; H03B 2201/0208
  USPC .... 331/34, 36 C, 117 FE, 117 R, 167, 177 V
  See application file for complete search history.

(56) References Cited

U.S. PATENT DOCUMENTS

| | | |
|---|---|---|
| 3,538,450 A | 11/1970 | Andrea et al. |
| 4,580,107 A | 4/1986 | Caldwell et al. |
| 5,084,685 A | 1/1992 | Moller |
| 5,117,206 A | 5/1992 | Imamura |
| 5,446,416 A | 8/1995 | Lin et al. |
| 5,493,715 A | 2/1996 | Humphreys et al. |
| 5,631,592 A | 5/1997 | Schwarz et al. |
| 5,764,112 A | 6/1998 | Bal et al. |
| 6,016,080 A | 1/2000 | Zuta et al. |
| 6,072,842 A | 6/2000 | Janesch et al. |
| 6,097,768 A | 8/2000 | Janesch et al. |
| 6,181,218 B1 | 1/2001 | Clark et al. |
| 6,198,353 B1 | 3/2001 | Janesch et al. |
| 6,281,758 B1 * | 8/2001 | Elsayed et al. ................. 331/16 |
| 6,326,851 B1 | 12/2001 | Staszewski et al. |
| 6,326,961 B1 | 12/2001 | Lin et al. |
| 6,329,941 B1 | 12/2001 | Farooqi |

(Continued)

OTHER PUBLICATIONS

Aparicio, R. et al., "A noise-shifting differential Colpitts VCO," IEEE Journal of Solid-State Circuits, Dec. 2002, pp. 1728-1736, vol. 37, No. 12, IEEE.

(Continued)

*Primary Examiner* — Levi Gannon
(74) *Attorney, Agent, or Firm* — Withrow & Terranova, P.L.L.C.

(57) ABSTRACT

The described devices, systems and methods include a voltage controlled oscillator. The voltage controlled oscillator includes a fine-tuning varactor network, a switch capacitor array having a first plurality of binary capacitor array elements and a second plurality of thermometer code capacitor array elements, and a tank inductor network including a first inductor in parallel with a second inductor.

10 Claims, 7 Drawing Sheets

(56) References Cited

U.S. PATENT DOCUMENTS

| | | | |
|---|---|---|---|
| 6,414,555 B2 | 7/2002 | Staszewski et al. | |
| 6,429,699 B1 | 8/2002 | Shi et al. | |
| 6,473,021 B1 | 10/2002 | Somayajula et al. | |
| 6,504,437 B1 | 1/2003 | Nelson et al. | |
| 6,563,390 B1 | 5/2003 | Kizziar | |
| 6,587,529 B1 | 7/2003 | Staszewski et al. | |
| 6,606,004 B2 | 8/2003 | Staszewski et al. | |
| 6,650,721 B1 | 11/2003 | Janesch et al. | |
| 6,658,748 B1 | 12/2003 | Leipold et al. | |
| 6,693,468 B2 | 2/2004 | Humphreys et al. | |
| 6,710,664 B2 | 3/2004 | Humphreys et al. | |
| 6,724,265 B2 | 4/2004 | Humphreys | |
| 6,731,145 B1 | 5/2004 | Humphreys et al. | |
| 6,734,741 B2 | 5/2004 | Muhammad et al. | |
| 6,747,522 B2 | 6/2004 | Pietruszynski | |
| 6,791,422 B2 | 9/2004 | Staszewski et al. | |
| 6,798,301 B1 * | 9/2004 | Balan et al. | 331/74 |
| 6,806,786 B1 | 10/2004 | Lam et al. | |
| 6,838,951 B1 | 1/2005 | Nieri et al. | |
| 6,851,493 B2 | 2/2005 | Staszewski et al. | |
| 6,906,596 B2 * | 6/2005 | Kitamura et al. | 331/36 C |
| 7,023,282 B1 | 4/2006 | Humpreys et al. | |
| 7,064,591 B1 | 6/2006 | Humphreys et al. | |
| 7,098,754 B2 | 8/2006 | Humphreys et al. | |
| 7,113,052 B2 * | 9/2006 | Dunworth | 331/179 |
| 7,199,674 B2 * | 4/2007 | Ash | 331/107 A |
| 7,250,826 B2 * | 7/2007 | Gabara | 331/117 R |
| 7,279,988 B1 | 10/2007 | Janesch et al. | |
| 7,385,453 B2 * | 6/2008 | Nervegna | 331/176 |
| 7,449,970 B2 * | 11/2008 | Yu et al. | 331/177 V |
| 7,750,685 B1 | 7/2010 | Bunch et al. | |
| 7,782,151 B2 * | 8/2010 | Buell | 331/177 V |
| 7,782,152 B2 * | 8/2010 | Darabi et al. | 331/177 V |
| 7,902,933 B1 * | 3/2011 | Brennan | 331/158 |
| 7,932,784 B1 | 4/2011 | Janesch et al. | |
| 8,193,843 B1 | 6/2012 | Stegmeir | |
| 2003/0197564 A1 | 10/2003 | Humphreys et al. | |
| 2004/0183601 A1 | 9/2004 | Zhang | |
| 2005/0057290 A1 | 3/2005 | Dalton et al. | |
| 2005/0231296 A1 * | 10/2005 | Souetinov | H03B 5/1228 331/177 V |
| 2007/0247237 A1 * | 10/2007 | Mohammadi | 331/36 C |
| 2008/0231375 A1 | 9/2008 | Welz et al. | |

OTHER PUBLICATIONS

Kurachi, S. et al., "5-GHz Band Highly Linear VCO IC with a Novel Resonant Circuit," 2007 Topical Meeting on Silicon Monolithic Integrated Circuits in RF Systems, Jan. 10-12, 2007, pp. 285-288, IEEE.

Hajimiri, Ai. et al., "A General Theory of Phase Noise in Electrical Oscillators," IEEE Journal of Solid-State Circuits, Feb. 1998, pp. 179-194, vol. 33, No. 2, IEEE.

Andreani, P. et al, "A Study of Phase Noise in Colpitts and LC-Tank CMOS Oscillators," IEEE Journal of Solid-State Circuits, May 2005, pp. 1107-1118, vol. 40, No. 5, IEEE.

Ham, D. et al, "Concepts and Methods in Optimization of Integrated LC VCOs," IEEE Journal of Solid-State Circuits, Jun. 2001, pp. 896-909, vol. 36, No. 6, IEEE.

Hajimiri, A. et al, "Low Noise Oscillators," Kluwer Academic Publishers, 2004, pp. 124-127.

Aktas, A. et al, "CMOS PLLs and VCOs for 4G Wireless," Kluwer Academic Publishers, 2004, pp. 96-97.

Manetakis, K. et al, "A CMOS VCO with 48% Tuning Range for Modern Broadband Systems," Proceedings of the IEEE 2004 Custom Integrated Circuits Conference, Oct. 3-6, 2004, pp. 265-268, IEEE.

Hajimiri, A. et al, "Design Issues in CMOS Differential LC Oscillators," IEEE Journal of Solid-State Circuits, May 1999, pp. 717-724, vol. 34, No. 5, IEEE.

Lee, C.H. et al, "A 0.18um SiGe BiCMOS UHF VCO with Auto Tuning for DCT AMPS and CDMA Application," Radio Frequency Integrated Circuits (RFIC) Symposium, 2004 IEEE Digest of Papers, Jun. 6-8, 2004, pp. 471-474, IEEE.

Hegazi, E. et al, "A Filtering Technique to Lower LC Oscillator Phase Noise," IEEE Journal of Solid-State Circuits, Dec. 2001, pp. 1921-1930, vol. 36, No. 12, IEEE.

Andreani, P. et al., "A 2.3GHz LC-Tank CMOS VCO with Optimal Phase Noise Performance", International Solid-State Circuits Conference, Digest of Technical Papers, Feb. 6-9, 2006, IEEE, pp. 691-700.

Kral, A. et al. "RF-CMOS Oscillators with Switched Tuning," IEEE 1998 Custom Integrated Circuits Conference, 1998, IEEE, pp. 555-558.

Staszewski, Robert Bogdan et al., "A First Multigigahertz Digitally Controlled Oscillator for Wireless Applications," IEEE Transactions on Microwave Theory and Techniques, vol. 51, No. 11, Nov. 2003, pp. 2154-2164.

Staszewski, Robert Bogdan et al., "Digitally Controlled Oscillator (DCO)-Based Architecture for RF Frequency Synthesis in a Deep-Submicrometer CMOS Process," IEEE Transactions on Circuits and Systems—II: Analog and Digital Signal Processing, vol. 50, No. 11, Nov. 2003, IEEE, pp. 815-828.

Steinkamp, J. et al., "A Colpitts Oscillator Design for a GSM Base Station Synthesizer," Radio Frequency Integrated Circuits Symposium, 2007, IEEE, pp. 405-408.

Wilson, William B. et al. "A CMOS Self-Calibrating Frequency Synthesizer," IEEE Journal of Solid-State Circuits, vol. 35, No. 10, Oct. 2000, IEEE, pp. 1437-1444.

Non-Final Office Action for U.S. Appl. No. 11/082,277, mailed Nov. 3, 2006, 5 pages.

Final Office Action for U.S. Appl. No. 11/082,277, mailed Apr. 13, 2007, 5 pages.

Notice of Allowance for U.S. Appl. No. 11/082,277, mailed May 31, 2007, 4 pages.

Mon-Final Office Action for U.S. Appl. No. 11/854,917, mailed Mar. 24, 2010, 8 pages.

Notice of Allowance for U.S. Appl. No. 11/854,917, mailed Sep. 10, 2010, 4 pages.

Notice of Allowance for U.S. Appl. No. 12/251,757, mailed Mar. 29, 2010, 6 pages.

* cited by examiner

INFRASTRUCTURE-GRADE INTEGRATED VOLTAGE CONTROLLED OSCILLATOR (VCO) WITH LINEAR TUNING CHARACTERISTICS AND LOW PHASE NOISE

This application claims the benefit of U.S. Provisional Patent Application 61/246,869 entitled AN INFRASTRUCTURE-GRADE INTEGRATED VOLTAGE CONTROLLED OSCILLATOR (VCO) WITH LINEAR TUNING CHARACTERISTICS AND LOW PHASE NOISE, filed Sep. 29, 2009, the disclosure of which is incorporated herein by reference in its entirety.

FIELD OF THE DISCLOSURE

This application relates to integrated voltage controlled oscillators (VCO). The application further relates to infrastructure-grade integrated VCOs.

BACKGROUND

Demand for a highly-integrated transceiver solution has increased greatly in the wireless infrastructure market in response to improvements in technology performance. Historically, infrastructure transceivers employed lower levels of on-chip integration than handset transceivers in order to achieve the higher performance requirements of infrastructure systems. One of the main limiting components preventing on-chip integration is the Local Oscillator (LO) source, which is typically a Voltage Controlled Oscillator (VCO). The phase noise performance of the LO is one of the most critical metrics in an infrastructure transceiver. For many applications, the only possible solution to achieve the required noise specifications is to utilize an off-chip, discrete component VCO or entire Phase-Locked Loop (PLL) module. Despite efforts to develop a fully-integrated infrastructure transceiver, an integrated VCO with overall performance approaching that of high-performance discrete component modules has not yet been achieved.

Accordingly, there is a need to develop an integrated infrastructure VCO in order to reduce the cost and space required to implement an infrastructure transceiver.

SUMMARY OF THE DETAILED DESCRIPTION

Embodiments in the detailed description are related to a differential voltage controlled oscillator (VCO). The voltage controlled oscillator includes a fine-tuning varactor network, a switch capacitor array having a first plurality of binary capacitor array elements and a second plurality of thermometer code capacitor array elements, and a tank inductor network including a first inductor in parallel with a second inductor.

A first exemplary embodiment includes a voltage controlled oscillator having a gain stage and a fine-tuning varactor network coupled in parallel with the gain stage. The fine-tuning varactor network may include a first tuning port output, a second tuning port output and a varactor bias voltage tuning port. The voltage controlled oscillator may further include a switch capacitor array coupled in parallel with the gain stage and the fine tuning-varactor network and a tank inductor network including a first inductor in parallel with a second inductor.

Another exemplary embodiment includes a capacitor array including a capacitor array element. The capacitor array may include an NFET switch coupled to a capacitor to form a first node. The capacitor array may further include a DC pedestal and voltage swing reduction circuit. The DC pedestal and voltage swing reduction circuitry may include a first filter having a first filter input and a first filter output, where the first filter input is coupled to the first node. The DC pedestal and voltage swing reduction circuitry may further include a second filter having a second filter input and a second filter output, a transmission gate coupled to the first filter output, and the second filter input, and a pedestal switch coupled to the second filter output. The transmission gate and the pedestal switch may be configured to be on when the NFET switch is off.

Still another exemplary embodiment includes a differential VCO tuning port comprising a tuning port coupled to a first varactor and a second varactor. In addition, a first tuning capacitor may be coupled between the first varactor and a first tuning port output, wherein a capacitance of the first tuning capacitor is smaller than a capacitance of the first varactor. A second tuning capacitor may be coupled between the second varactor and a second tuning port output, where a capacitance of the second tuning capacitor is smaller than a capacitance of the second varactor.

Another exemplary embodiment includes a segmented switch capacitor array including a first plurality of binary capacitor array elements. Each of the first plurality of binary capacitor array elements has $2^N$ multiples of a unit capacitance and FET switch size. The segmented switch capacitor array further includes a second plurality of thermometer code capacitor array elements, where each of the second plurality of thermometer code capacitor array elements are thermometer code capacitor array elements that have equal capacitances and switch device sizes.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments in the detailed description are related to a differential voltage controlled oscillator (VCO). The voltage controlled oscillator includes a fine-tuning varactor network, a switch capacitor array having a first plurality of binary capacitor array elements and a second plurality of thermometer code capacitor array elements, and a tank inductor network including a first inductor in parallel with a second inductor.

A first exemplary embodiment includes a voltage controlled oscillator having a gain stage and a fine-tuning varactor network coupled in parallel with the gain stage. The fine-tuning varactor network may include a first tuning port output, a second tuning port output and a varactor bias voltage tuning port. The voltage controlled oscillator may further include a switch capacitor array coupled in parallel with the gain stage and the fine tuning-varactor network and a tank inductor network including a first inductor in parallel with a second inductor.

Figure 1:
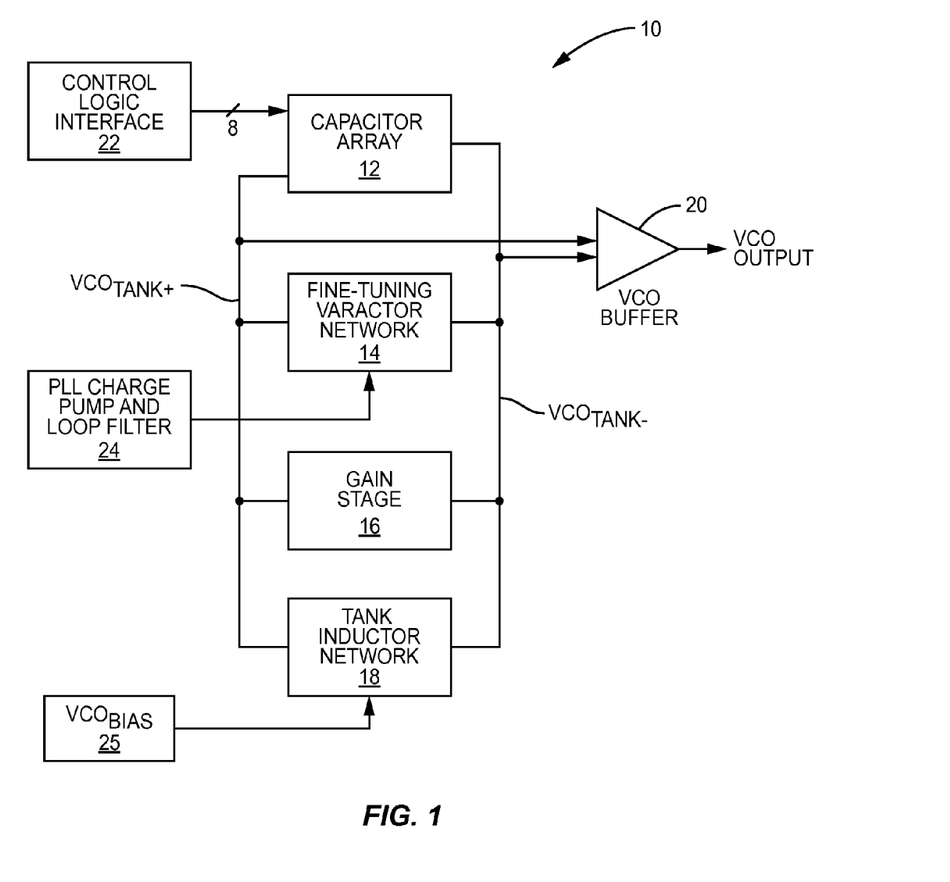
FIG. 1 depicts an embodiment of an infrastructure grade integrated voltage controlled oscillator (VCO).

FIG. 1 depicts an infrastructure-grade integrated voltage control oscillator (VCO) 10, hereinafter referred to as an integrated VCO 10.

The integrated VCO 10 may be a differential VCO. As an example, some embodiments of the integrated VCO 10 may be a VCO having a Colpitts core. The Colpitts core oscillates at a frequency in which the phase-shift through the feedback is about 180 degrees. The phase-shift around the loop is 360 degrees and the gain around the loop is unity.

As depicted in FIG. 1, the integrated VCO 10 includes differentially coupled elements configured to generate a VCO Output. The integrated VCO 10 may include a capacitor array 12, a fine-tuning varactor network 14, a gain stage 16, a tank inductor network 18, and VCO buffer 20 coupled between the $VCO_{TANK+}$ and $VCO_{TANK-}$ signal lines. The capacitor array 12 may be coupled to a control logic interface 22, which includes an eight bit address bus. The eight bit address bus corresponds to the control line $B_0$, $B_1$, $B_2$, $B_3$, $B_4$, $B_5$, $B_6$, and $B_7$, as depicted in FIGS. 1-4.

Continuing with FIG. 1, the fine-tuning varactor network 14 may be configured to receive a tuning voltage $V_{TUNE}$ from a phase lock loop (PLL) charge pump with loop filter 24. The phase lock loop (PLL) charge pump with loop filter 24 is described in the co-pending patent application Ser. No. 12/823,669, entitled "CHARGE PUMP TRACKING CIRCUIT FOR A PHASE LOCK LOOP," now U.S. Pat. No. 8,193,843, which is herein incorporated by reference in its entirety.

The tank inductor network 18 may be coupled to a voltage control oscillator bias voltage ($VCO_{BIAS}$). The bias voltage provides a DC bias voltage to the cores of the differential inductors, discussed below, in the tank inductor network 18.

Figure 2:
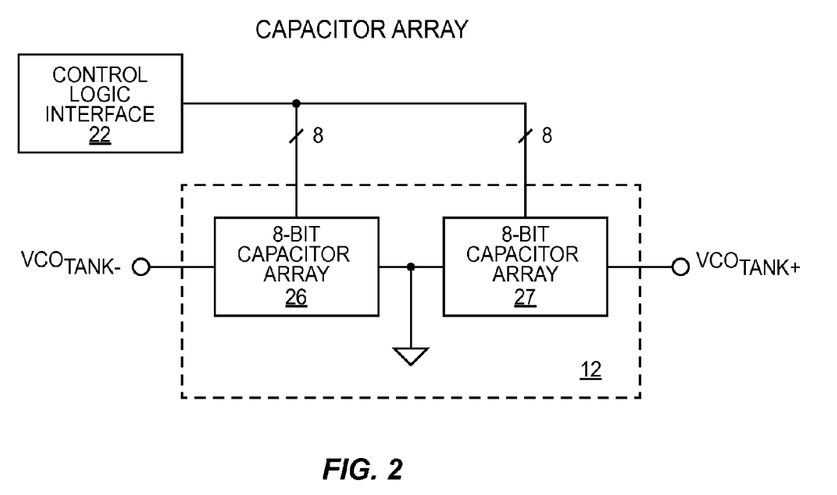
FIG. 2 depicts a binary encoded/thermometer weighted hybrid capacitor array.
Figure 3:
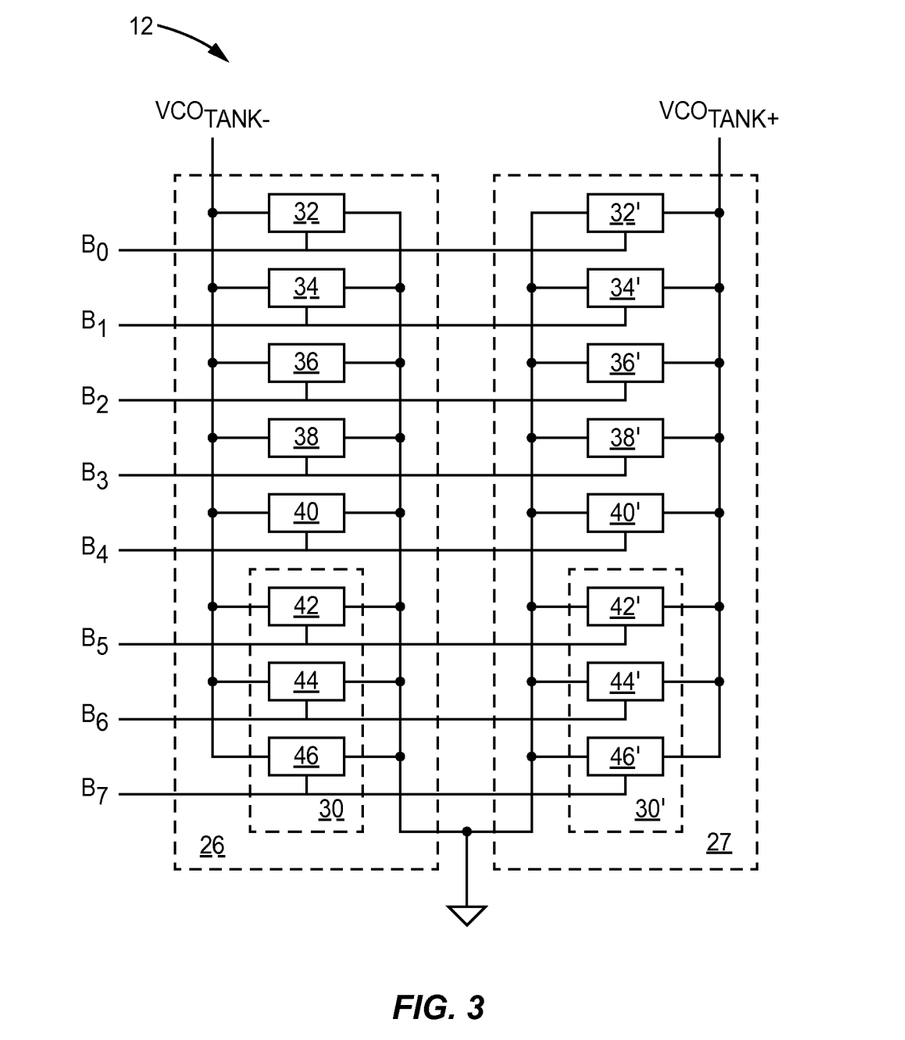
FIG. 3 depicts the capacitor array of FIG. 2.
Figure 4:
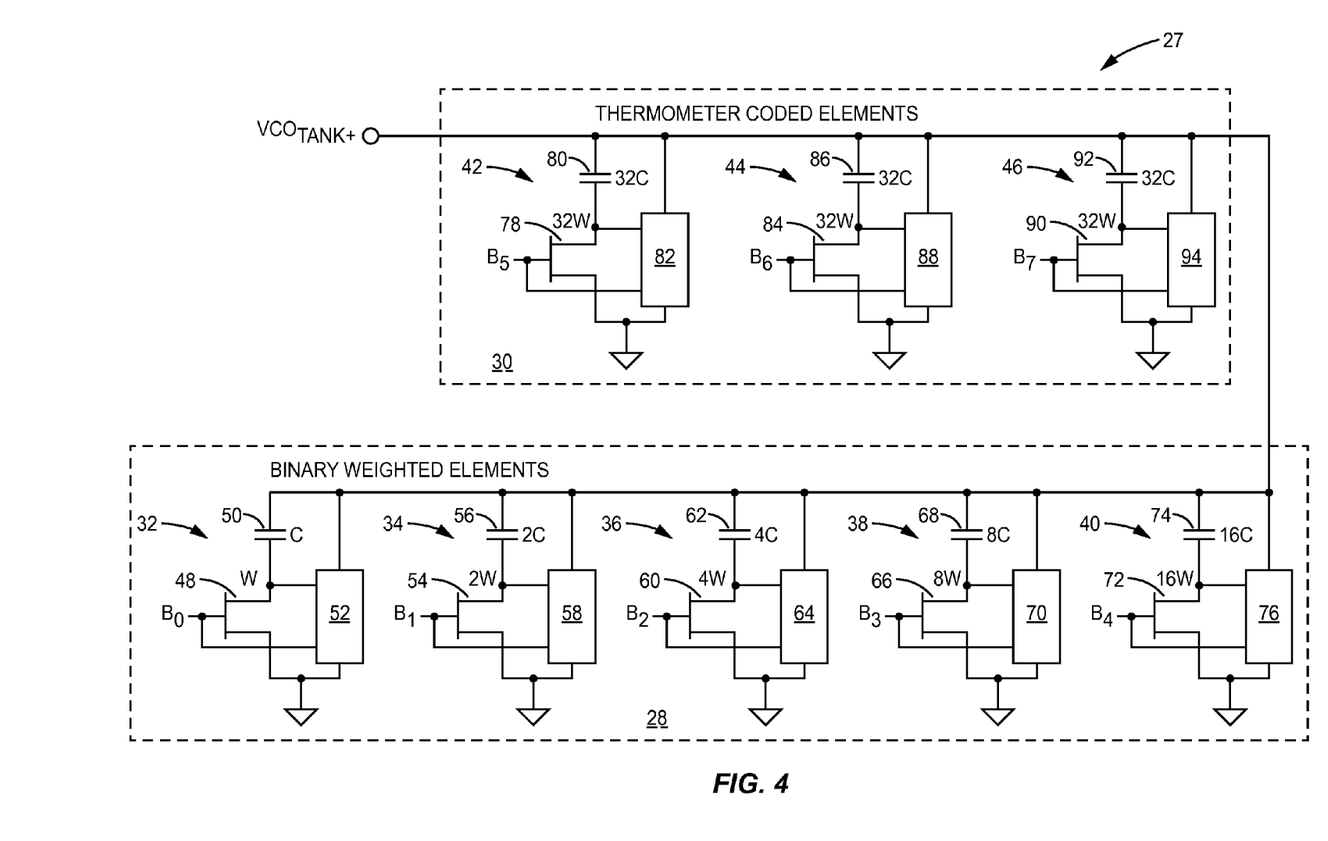
FIG. 4 depicts the 8-bit switch capacitor array of FIGS. 2 and 3.

FIGS. 2, 3 and 4 depict the capacitor array 12. In FIG. 2, a first 8-bit switch capacitor array 26 and a second 8-bit switch capacitor array 27 are configured to form the capacitor array 12. The first 8-bit switch capacitor array 26 and the second 8-bit capacitor array 27 are arrange to provide differential outputs to the $VCO_{TANK-}$ and $VCO_{TANK+}$ signal lines of the integrated VCO 10. As further depicted in FIG. 3, the second 8-bit switch capacitor array 27 is configured to be the mirror image of the first 8-bit capacitor array 26.

FIG. 3 depicts the first 8-bit switch capacitor array 26 and the second 8-bit switch capacitor array 27. The first 8-bit switch capacitor array 26 is segmented into binary weighted elements 28 and thermometer coded elements 30. The binary weighted elements 28 includes a first binary weighted element 32, a second binary weighted element 34, a third binary weighted element 36, a fourth binary weighted element 38, and a fifth binary weighted element 40 corresponding to the bits $B_0$, $B_1$, $B_2$, $B_3$, and $B_4$ of the control line from the control logic interface 22. The capacitance associated with each of the binary weighted elements is approximately $2^N C$, where "C" is a nominal unit of capacitance and N corresponds to the subscript "N" for each $B_N$, for N=0 to 4.

The thermometer coded elements 30 include a first thermometer coded element 42, a second thermometer coded element 44, and a third thermometer element 46 corresponding to the bits $B_5$, $B_6$, and $B_7$ of the control line from the control logic interface 22. The capacitance of each of the thermometer coded elements 30 is 32 C.

The second 8-bit switch capacitor array 27 is segmented into binary weighted elements 30' and thermometer coded elements 28', wherein like numbers have the same characteristic and function. The binary weighted elements 28' includes a first binary weighted element 32', a second binary weighted element 34', a third binary weighted element 36', a fourth binary weighted element 38', and a fifth binary weighted element 40' corresponding to the bits $B_0$, $B_1$, $B_2$, $B_3$, and $B_4$ of the control line from the control logic interface 22. The thermometer coded elements 30' includes a first thermometer coded element 42', a second thermometer coded element 44', and a third thermometer element 46' corresponding to the bits $B_5$, $B_6$, and $B_7$ of the control line from the control logic interface 22.

As further depicted in FIG. 4, the first binary weighted element 32 includes a first field effect (FET) transistor 48 coupled to a first capacitor 50. The first capacitor 50 is coupled to the $VCO_{TANK-}$ signal line. A first direct current (DC) pedestal and voltage swing reduction circuit 52 is coupled across the drain and source of the first FET transistor 48. The first FET transistor 48 is coupled to bit $B_0$ of the control line from the control logic interface 22. The first FET transistor 48 has a drain to source channel width of "1 W," where "W" is a nominal unit of width. The first capacitor 50 has a capacitance of "1 C", where C is the unit capacitance for the capacitor array 12. When the first FET transistor 48 is active, the first capacitor 50 is in the circuit. When the first FET transistor 48 is inactive, the first capacitor 50 is effectively taken out of the circuit.

The second binary weighted element 34 includes a second field effect (FET) transistor 54 coupled to a second capacitor 56. The second capacitor 54 is coupled to the $VCO_{TANK-}$ signal line. A second direct current (DC) pedestal and voltage swing reduction circuit 58 is coupled across the drain and source of the second FET transistor 54. The gate of the second FET transistor 54 is coupled to bit $B_1$ of the control line from the control logic interface 22. The second FET transistor 54 has a drain to source channel width of "2 W," and is coupled to bit $B_1$ of the control line from the control logic interface 22. The second capacitor 50 has a capacitance of 2 C.

The third binary weighted element 36 includes a third field effect (FET) transistor 60 coupled to a third capacitor 62. The third capacitor 62 is coupled to the $VCO_{TANK-}$ signal line. A third direct current (DC) pedestal and voltage swing reduction circuit 64 is coupled across the drain and source of the third FET transistor 60. The gate of the third FET transistor 60 is coupled to bit $B_2$ of the control line from the control logic interface 22. The third FET transistor 60 has a drain to source channel width of "4 W," and is coupled to bit $B_2$ of the control line from the control logic interface 22. The third capacitor 62 has a capacitance of 4 C.

The fourth binary weighted element 38 includes a fourth field effect (FET) transistor 66 coupled to a fourth capacitor 68. The fourth capacitor 68 is coupled to the $VCO_{TANK-}$ signal line. A fourth direct current (DC) pedestal and voltage swing reduction circuit 70 is coupled across the drain and source of the fourth FET transistor 66. The gate of the fourth FET transistor 66 is coupled to bit $B_3$ of the control line from the control logic interface 22. The fourth FET transistor 66 has a drain to source channel width of "8 W," and is coupled to bit $B_3$ of the control line from the control logic interface 22. The fourth capacitor 62 has a capacitance of 8 C.

The fifth binary weighted element 40 includes a fifth field effect (FET) transistor 72 coupled to a fifth capacitor 74. The fifth capacitor 74 is coupled to the $VCO_{TANK-}$ signal line. A fifth direct current (DC) pedestal and voltage swing reduction circuit 76 is coupled across the drain and source of the fourth FET transistor 66. The gate of the fifth FET transistor 72 is coupled to bit $B_4$ of the control line from the control logic interface 22. The fourth FET transistor 72 has a drain to source channel width of "16 W," and is coupled to bit $B_4$ of the control line from the control logic interface 22. The fourth capacitor 74 has a capacitance of 16 C.

The first thermometer coded element 42 includes a sixth field effect (FET) transistor 78 coupled to a sixth capacitor 80. The sixth capacitor 80 is coupled to the $VCO_{TANK-}$ signal line. A sixth direct current (DC) pedestal and voltage swing reduction circuit 82 is coupled across the drain and source of the sixth FET transistor 78. The gate of the sixth FET transistor 78 is coupled to bit $B_5$ of the control line from the control logic interface 22. The sixth FET transistor has a drain to source channel width of "32 W." The sixth capacitor 80 has a capacitance of 32 C.

The second thermometer coded element 44 includes a first field effect (FET) transistor 84 coupled to a seventh capacitor 86. The seventh capacitor 86 is coupled to the $VCO_{TANK-}$ signal line. A seventh direct current (DC) pedestal and voltage swing reduction circuit 88 is coupled across the drain and source of the first FET transistor 84. The gate of the seventh FET transistor 86 is coupled to bit $B_6$ of the control line from the control logic interface 22. The seventh FET transistor 86 has a drain to source channel width of "32 W." The seventh capacitor 40 has a capacitance of 32 C.

The third thermometer coded element 46 includes an eighth field effect (FET) transistor 90 coupled to an eighth capacitor 92. The eighth capacitor 92 is coupled to the $VCO_{TANK-}$ signal line. An eighth direct current (DC) pedestal and voltage swing reduction circuit 94 is coupled across the drain and source of the eighth FET transistor 94. The gate of the eighth FET transistor 90 is coupled to bit $B_7$ of the control line from the control logic interface 22. The eighth FET transistor 90 has a drain to source channel width of "32 W." The eighth capacitor 92 has a capacitance of 32 C.

As discussed below relative to FIG. 5, the second direct current (DC) pedestal and voltage swing reduction circuit 58 is configured to provide a DC voltage pedestal to the drain of the FET transistor 54 when the FET transistor 54 is in an inactive (off) state, which prevents the drain of the FET transistor 54 from floating relative to ground.

Figure 5:
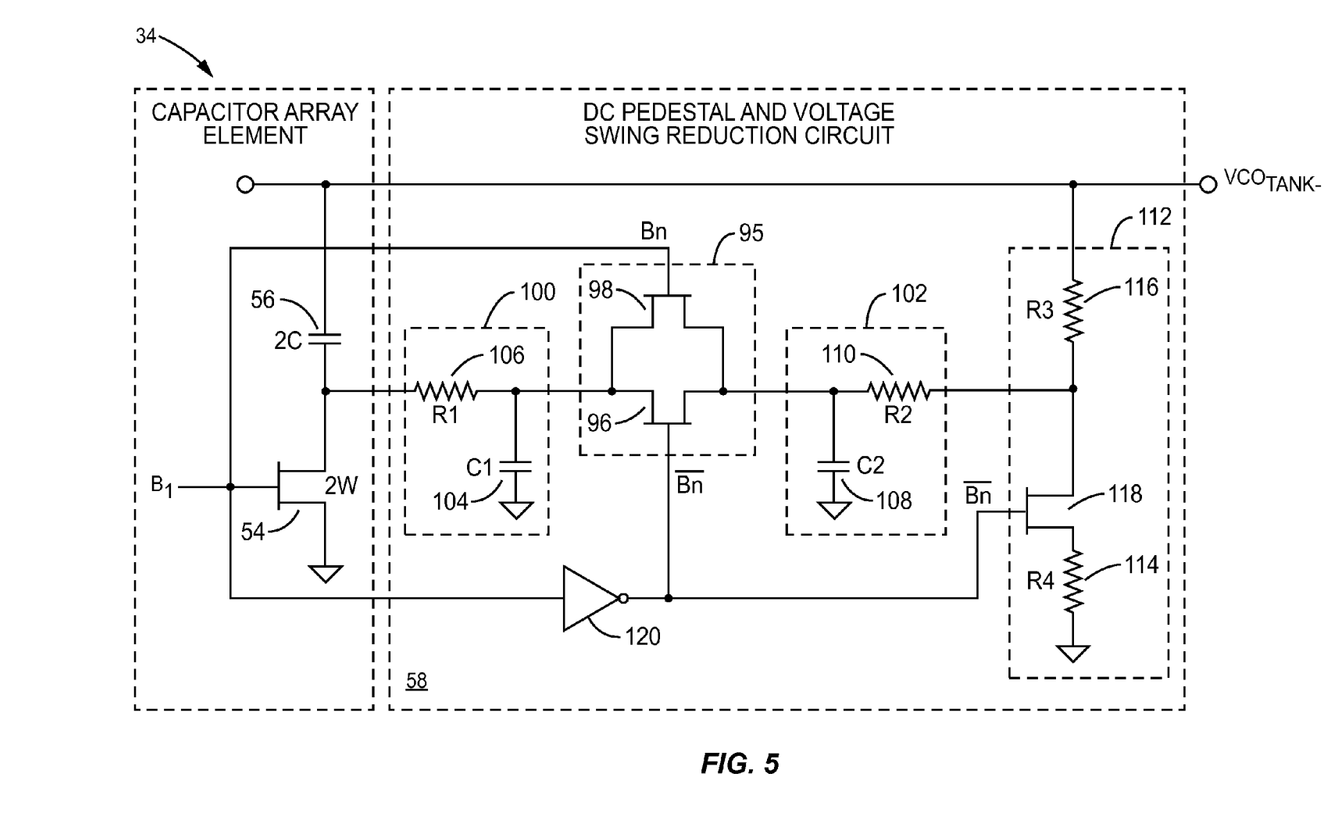
FIG. 5 depicts a direct current (DC) pedestal and voltage swing reduction circuit of FIG. 4.

FIG. 5 depicts an example of the DC pedestal and voltage swing reduction circuit 58 in relation to the second binary weighted element 34 of FIG. 4. The DC pedestal and voltage swing reduction circuit 58 establishes a stable bias condition and prevents negative voltage swings on the second FET transistor 54. The circuit includes a transmission gate 95 comprising a transmission gate NFET transistor 96 and a transmission gate PFET transistor 98.

The transmission gate 95 lies between a first low pass filter 100 and a second low pass filter 102. The first low pass filter 100 comprises a first filter capacitor 104 and a first filter resistor 106, where the first filter resistor 106 is coupled to the drain of the second FET transistor 54. The second low pass filter 102 comprises a second filter capacitor 108 and a second filter capacitor 110.

In addition, a pedestal circuit 112 provides a DC pedestal voltage when the second FET transistor 54 is turned off. The pedestal circuit 112 includes a voltage divider network composed of a first divider resistor 114 and a second divider resistor 116 coupled to a switch transistor 118. The switch transistor 118 is configured to switch in a voltage divider network when the second FET transistor 54 is turned off. When the switch transistor 118 is in a saturation mode of operating, the DC pedestal voltage at the drain of the switch transistor 118 is equal to $VCO_{TANK-}$ (R4/(R3+R4)). The DC pedestal voltage passes through the first resistor 106, the transmission gate 95, and the second resistor 110 to the drain of the second FET transistor 54, which prevents the drain of the second FET transistor 54 from floating when the second FET transistor 54 is turned off.

Figure 6:
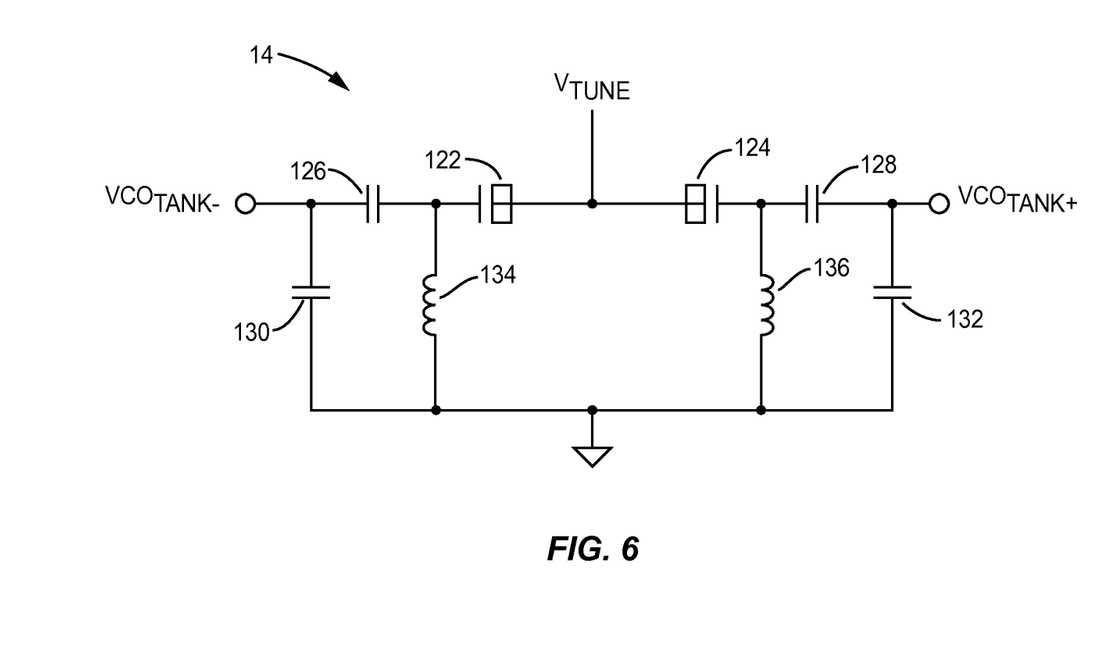
FIG. 6 depicts a fine-tuning VCO network of FIG. 1.

FIG. 6 depicts a fine-tuning varactor network 14 configured to provide a differential output to $VCO_{Tank-}$ and $VCO_{Tank+}$. The fine-tuning varactor network 14 includes a first varactor 122 coupled to a second varactor 124, where the first varactor 122 and the second varactor 124 receive a tuning voltage $V_{TUNE}$ from the phase lock loop (PLL) charge pump with loop filter 24. The first varactor 122 is further coupled to a first series capacitor 126, which is coupled to $VCO_{TANK-}$. The second varactor 124 is further coupled to a second series capacitor 128, which is coupled to $VCO_{TANK+}$.

A first shunt capacitor 130 is coupled between the first series capacitor 126 and a common voltage or ground. Similarly, a second shunt capacitor 132 is coupled between the second series capacitor 128 and a common voltage or ground. The first shunt capacitor 130 and the second shunt capacitor 132 may be adjusted to set the $K_V$ of the fine tuning varactor network 14 at the operating frequency, which is the relationship between frequency change of the integrated VCO 10 to the change in the tuning voltage $V_{TUNE}$.

A first shunt inductor 134 couples the first series capacitor 126 and the first varactor 122 to ground. A second shunt inductor 136 couples the second series capacitor 128 and the second varactor 124 to ground. The first shunt inductor 130 and second shunt inductor 132 provide a DC bias to the first varactor 122 and the second varactor 124, respectively, and appear as a high impedance at the operating frequency of the fine-tuning varactor network 14. Selecting the capacitance of the first varactor 122 and the second varactor 124 to be substantially larger than the first series capacitor 126 and second series capacitor 128, respectively, improves the linearity of response of the integrated VCO.

As an example, in some embodiments, the first series capacitor 126 and the second series capacitor 128 have a capacitance of between 1 pf to 2 pf. Correspondingly, the first varactor 122 and the second varactor 124 may have a capacitance of between 10 pf to 15 pf. Accordingly, the ratio of fixed series capacitance to a nominal varactor capacitance may range between about 1:8 to 1:14 for different embodiments. Still other embodiments may have a ratio of fixed series capacitance to a nominal varactor capacitance of around 1:10.

Accordingly, during normal operation, the combination of the first varactor 122 and the first series capacitor 126 provide a first variable capacitance in parallel with the first shunt capacitor 130. Likewise, the combination of the second varactor 124 and second series capacitor 128 provides a second variable capacitance in parallel with the second shunt capacitor 132.

Figure 7:
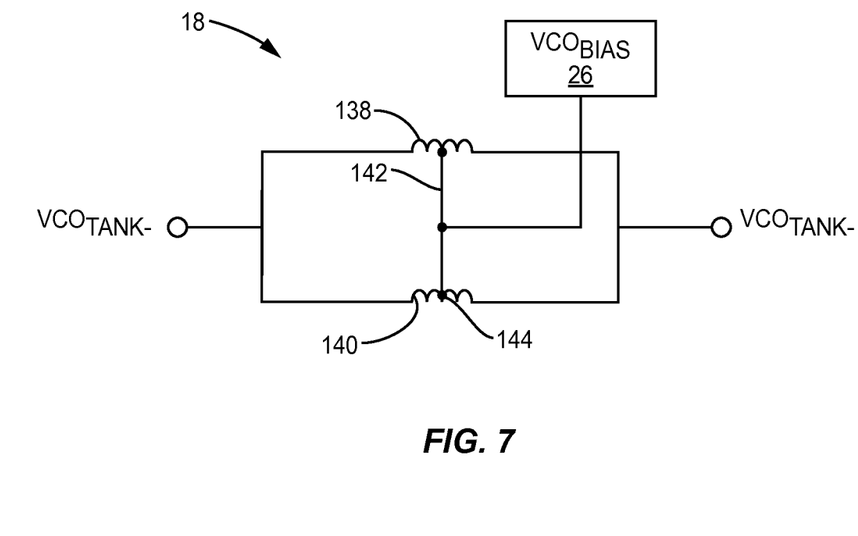
FIG. 7 depicts a differential tank circuit.

FIG. 7 depicts a tank inductor network 18 configured to provide differential outputs at $VCO_{TANK-}$ and $VCO_{TANK+}$. The tank inductor network 18 includes a first differential inductor 138 and a second differential inductor 140 coupled in parallel. A first center tap 142 of the first differential inductor 138 and a second center tap 144 of the second differential inductor 140 are coupled to the $VCO_{mAs}$ voltage. In some embodiments, the first center tap 142 of the first differential inductor 138 and the second center tap 144 of the second differential inductor 140 are coupled to a common voltage or ground.

The two inductor design permits selection from a family of standard inductors offered by the utilized process, where the family of standard inductors have an optimal range of inductances with respect to Q at the frequencies of interest. As an example, an optimum Q for a family of inductors may occur in the L=1 nH range. However, the optimum tank inductance with respect to oscillation frequency and Ctank/Ltank ratio may be approximately in the L=0.5 nH range. If a single differential inductor was used with L=0.5 nH, rather than two 1 nH inductors in parallel, the Q of the tank inductance may be significantly lower due to the Q vs. frequency characteristics of the inductors. This is because lower inductances have higher peak Q frequencies. For example, the peak Q for a 0.5 nH inductor may be several times over the desired operating frequency, while the peak Q of a 1 nH inductor may occur roughly at the operating frequency. Utilizing two larger parallel inductors allows the use of tank inductors that are operating near their peak Q, while providing the tank inductance that is needed to achieve the required output frequency and tuning characteristics. An added benefit of this approach is the symmetry that is provided by the use of two parallel inductors within the differential structure of the VCO. The added symmetry can lead to improved noise performance due to the increased balance in the circuit. A similar approach may be used to combine inductors in parallel and series to obtain the desired operating characteristics.

Those skilled in the art will recognize improvements and modifications to the embodiments of the present disclosure. All such improvements and modifications are considered within the scope of the concepts disclosed herein and the claims that follow.

What is claimed is:

1. A capacitor array comprising:
   a capacitor array element including an NFET switch coupled to a capacitor to form a first node;
   a DC pedestal and a voltage swing reduction circuit comprising:
      a first filter having a first filter input and a first filter output, the first filter input coupled to the first node;
      a second filter having a second filter input and a second filter output;
      a transmission gate coupled to the first filter output and the second filter input;
      a pedestal switch coupled to the second filter output; and
   wherein the transmission gate and the pedestal switch are configured to be on when the NFET switch is off.

2. The capacitor array of claim 1 wherein the pedestal switch further includes a FET transistor, a first resistor coupled between a drain of the transistor and a supply voltage, and a second resistor coupled between a source of the transistor and ground.

3. The capacitor array of claim 1 wherein the first filter is a single pole resistor-capacitor filter, and the second filter is a single pole resistor-capacitor filter.

4. The capacitor array of claim 1 wherein the transmission gate comprises a first PFET transistor coupled in parallel with a first NFET transistor.

5. The capacitor array of claim 1 wherein the capacitor in the capacitor array element is coupled between a supply voltage and the first node.

6. The capacitor array of claim 1 wherein a drain of the NFET switch is coupled to the first node and a source of the NFET switch is coupled to ground.

7. The capacitor array of claim 6 wherein the transmission gate comprises a first PFET transistor coupled in parallel with a first NFET transistor.

8. The capacitor array of claim 7 wherein a gate of the NFET switch is coupled to a gate of the first PFET transistor and coupled to a gate of the first NFET transistor via an inverter.

9. A capacitor array comprising:
   a capacitor coupled between a supply voltage and a first node;
   a capacitor switching element coupled between the first node and ground;
   a first filter coupled between the first node and a second node;
   a transmission gate coupled between the second node and a third node;
   a second filter coupled between the third node and a fourth node; and
   a pedestal switching element coupled between the fourth node and ground.

10. The capacitor array of claim 9 wherein the transmission gate and the pedestal switching element are operated complementary to the capacitor switching element.

* * * * *

UNITED STATES PATENT AND TRADEMARK OFFICE
CERTIFICATE OF CORRECTION

PATENT NO. : 9,503,017 B1  
APPLICATION NO. : 12/892049  
DATED : November 22, 2016  
INVENTOR(S) : Jacob K. Easter et al.

Page 1 of 1

It is certified that error appears in the above-identified patent and that said Letters Patent is hereby corrected as shown below:

In the Specification

In Column 7, Line 7, replace "$VCO_{mAs}$" with --$VCO_{BIAS}$--.

Signed and Sealed this  
Seventh Day of February, 2017

Michelle K. Lee  
*Director of the United States Patent and Trademark Office*